United States Patent
Boucard et al.

(10) Patent No.: US 7,755,920 B2
(45) Date of Patent: Jul. 13, 2010

(54) ELECTRONIC MEMORY DEVICE

(75) Inventors: Philippe Boucard, Le Chesnay (FR); Pascal Godet, Jouy en Josas (FR); Luc Montperrus, Montigny le Bretonneux (FR)

(73) Assignee: Arteris, Guyancourt (FR)

( * ) Notice: Subject to any disclaimer, the term of this patent is extended or adjusted under 35 U.S.C. 154(b) by 106 days.

(21) Appl. No.: 12/284,820

(22) Filed: Sep. 25, 2008

(65) Prior Publication Data

US 2009/0080280 A1    Mar. 26, 2009

(30) Foreign Application Priority Data

Sep. 26, 2007   (FR)   ................... 07 06740

(51) Int. Cl.
*G11C 5/02*    (2006.01)
*G11C 5/06*    (2006.01)
*G11C 7/00*    (2006.01)

(52) U.S. Cl. ............... 365/51; 365/63; 365/198

(58) Field of Classification Search ........... 365/51, 365/63, 198
See application file for complete search history.

(56) References Cited

U.S. PATENT DOCUMENTS

| 2003/0200339 | A1* | 10/2003 | Greenblat et al. | .......... 709/250 |
| 2005/0154843 | A1* | 7/2005 | Douady et al. | .............. 711/154 |

* cited by examiner

*Primary Examiner*—Ly D Pham
(74) *Attorney, Agent, or Firm*—Meyertons, Hood, Kivlin, Kowert & Goetzel, P.C.; Eric B. Meyertons (57) ABSTRACT

An electronic memory device includes a bank of memories provided with a cache, a sequencer for providing physical access to said bank of memories, a physical interface for receiving high level memory access requests, a request manager between the physical interface and the sequencer, said request manager includes an input queue for storing the high level memory access requests and an arbitration function which takes account of the data of the cache and the data of the input queue to designate a request which is to be executed, thus allowing the memory bank, the sequencer and the request manager to be provided on a single chip, the physical interface providing the connection of the chip with the outside.

10 Claims, 6 Drawing Sheets

ELECTRONIC MEMORY DEVICE

BACKGROUND OF THE INVENTION

1. Field of the Invention

The invention generally relates to an electronic memory device.

2. Description of the Relevant Art

Ongoing technological progress has resulted in the integration of more and more complex systems on a semiconductor chip, the systems comprising a number of functional modules.

The memory requirements of such systems integrated on a chip have increasingly developed in parallel. This development has promoted the use of large capacity memories known as DRAM.

To satisfy these increasing needs, so called embedded DRAM memories were initially developed by combining DRAM memory technologies with logic process technologies.

However, for reasons of cost and design, for the most part, embedded DRAM memories have had to be abandoned in favor of DRAM on dedicated chips.

DRAM memories of this kind separate from the system chip are accessible via low level physical interfaces, for example of the DDR type, for the most common ones, or of the Rambus® type for higher performance ones.

The increased need for large capacity memories has therefore resulted in an increased number of communication interfaces with DRAMs on the system chip and a constant increase in the bit rates of information exchange with the outside.

The solutions adopted for current DRAM interfaces have a certain number of drawbacks.

First of all, these are low level interfaces, i.e. they carry the elementary commands of the DRAM and their sequencing in the form of signals or signal packets, while conforming to the inter-command distances specified by the DRAM designers, to the nearest cycle.

Moreover, for the most common interfaces, the number of signals to be carried is fairly high and increasing, currently from 48 to 160 signals, and they generally use a mesochronous link, which makes them difficult to produce.

Furthermore, in order to limit the number of signals at the DRAM interfaces, two-way buses are used. However, the turnaround time of the bus then affects the performance of the interface, and a memory controller has to organize access so as to minimize the number of turnarounds of the bus.

To summarize, the DRAM interfaces are currently one of the major limiting factors for the performance of the system.

SUMMARY OF THE INVENTION

Embodiments of the device described herein have the particular aim of making the memory easier to integrate. To this end, an electronic memory device includes a bank of memories provided with a cache and a sequencer for providing physical access to said bank of memories.

The device further includes a physical interface for receiving high level memory access requests, and a request manager between the physical interface and the sequencer.

The request manager includes an input queue for storing the high level memory access requests and an arbitration function which takes account of the data in the cache and data in the input queue to designate a request which is to be executed, thus making it possible to produce the memory banks, the sequencer and the request manager on a single chip, the physical interface providing a connection for the chip with the outside.

An electronic memory device of this kind is particularly useful as it provides a memory chip which has the advantages of mass memories in terms of cost and performance while making the management of their interfaces more flexible.

A high level memory access request may be a data packet with a header and optionally associated data (writing) containing in the header an operating code (read or write), an address in the memory bank, a destination address and an address for tracing the sender (if there is more than one). The header contains the information needed to route the packet autonomously within a transportation network.

An advantage of this device, due in part to the request manager and sequencer, is that the memory no longer has to be operated with low-level commands, thus making the memory more autonomous and more capable of integration.

BRIEF DESCRIPTION OF THE DRAWINGS

Further features and advantages of the invention will become more apparent from a study of the description that follows, taken from embodiments provided as an illustration and without being restrictive, on the basis of the drawings wherein.

The drawings and description that follow essentially contain elements of a certain type. They may therefore be used not only to assist with the understanding of the present invention but also contribute to its definition, where appropriate.

DETAILED DESCRIPTION OF THE PREFERRED EMBODIMENTS

Figure 1:
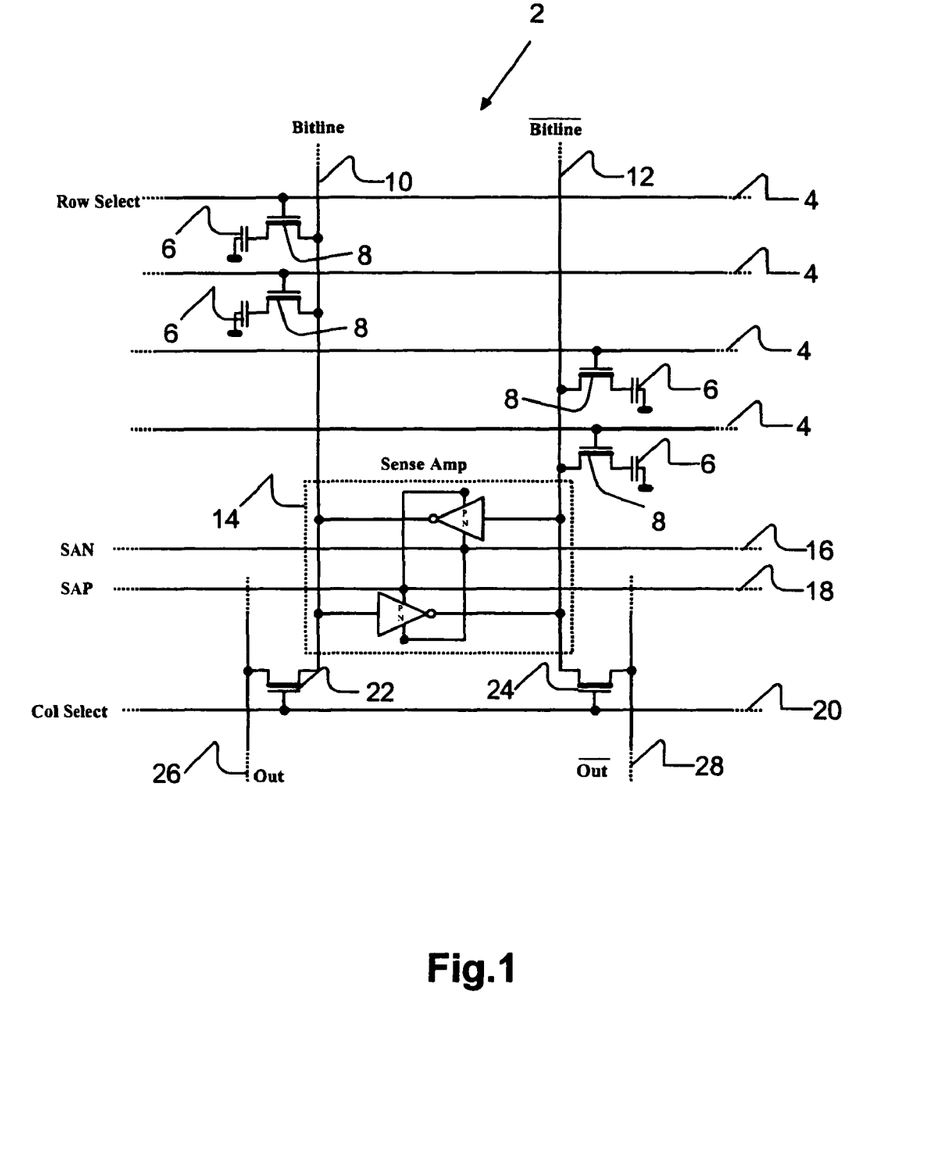
FIG. 1 shows a basic design of a DRAM type memory.

FIG. 1 shows a basic pattern 2 of a DRAM type memory bank. The term matrix may also be used to refer to the DRAM, as the latter is generally seen as a set of columns and rows of capacitances to which access is obtained.

The pattern 2 comprises row select lines 4, bit lines 10 and 12, command lines SAN 16 and SAP 18, a column select line 20, and output lines 26 and 28.

The row select lines 4 give access to a set of capacitances 6 by means of access transistors 8. The access transistors 8 are organized such that the potential of the capacitance 6 can be read differentially on the two bit lines 10 and 12.

The bit lines 10 and 12 are precharged and equalized beforehand to half the potential of the supply, and one acts as a reference for the other. The differential reading of the bit lines 10 and 12 is carried out in a differential amplifier 14, also known as a sense amplifier, by means of the lines SAN 16 and SAP 18.

The lines SAN 16 and SAP 18 are offset from one another and lag behind the row select command 4. This delay makes it possible to limit the short circuit current responsible for the main current peak in the DRAM, as will be described hereinafter.

The differential amplifier 14 has two other roles:

regenerating a correct potential on the bit lines 10 and 12 and in the capacitance 6 accessed, as the potential of the latter has been changed during the read operation. A charge pump mechanism may make it possible to reach the supply level behind the access transistor 8, if applicable;

acting as a memory point while the information in the row 4 is to be used.

The output lines 26 and 28 include access transistors 22 and 24 which allow access to the value of the memory point. The access transistors 22 and 24 are connected to the column select line 20. This line controls the reading of the value of the memory point. The sub-assembly accessed is referred to as a column.

All the differential amplifiers 14 with their access transistors 22 and 24 on the output lines 26 and 28 constitute a matrix of conventional memory points of the SRAM type with six transistors.

Accessing a "row" in the DRAM initializes the values of this SRAM. Access to the "column" makes it possible to use this SRAM. The internal SRAM matrix may be regarded as constituting a cache memory for the DRAM memory bank.

As the access time for a row is very long (several dozen ns), a large number of bits will be read, and the size of a row may be up to 16 Kbits for a 1 Gbit DRAM. The aim is to find, among the bits of the row, a maximum column access to be exploited, these forms of access being faster than access to a row.

Another special feature of this memory is the degradation of information over time as a result of various leaks, hence the name "dynamic memory". To compensate for this degradation it is necessary to refresh the matrix periodically, as will be described below.

Figure 2:
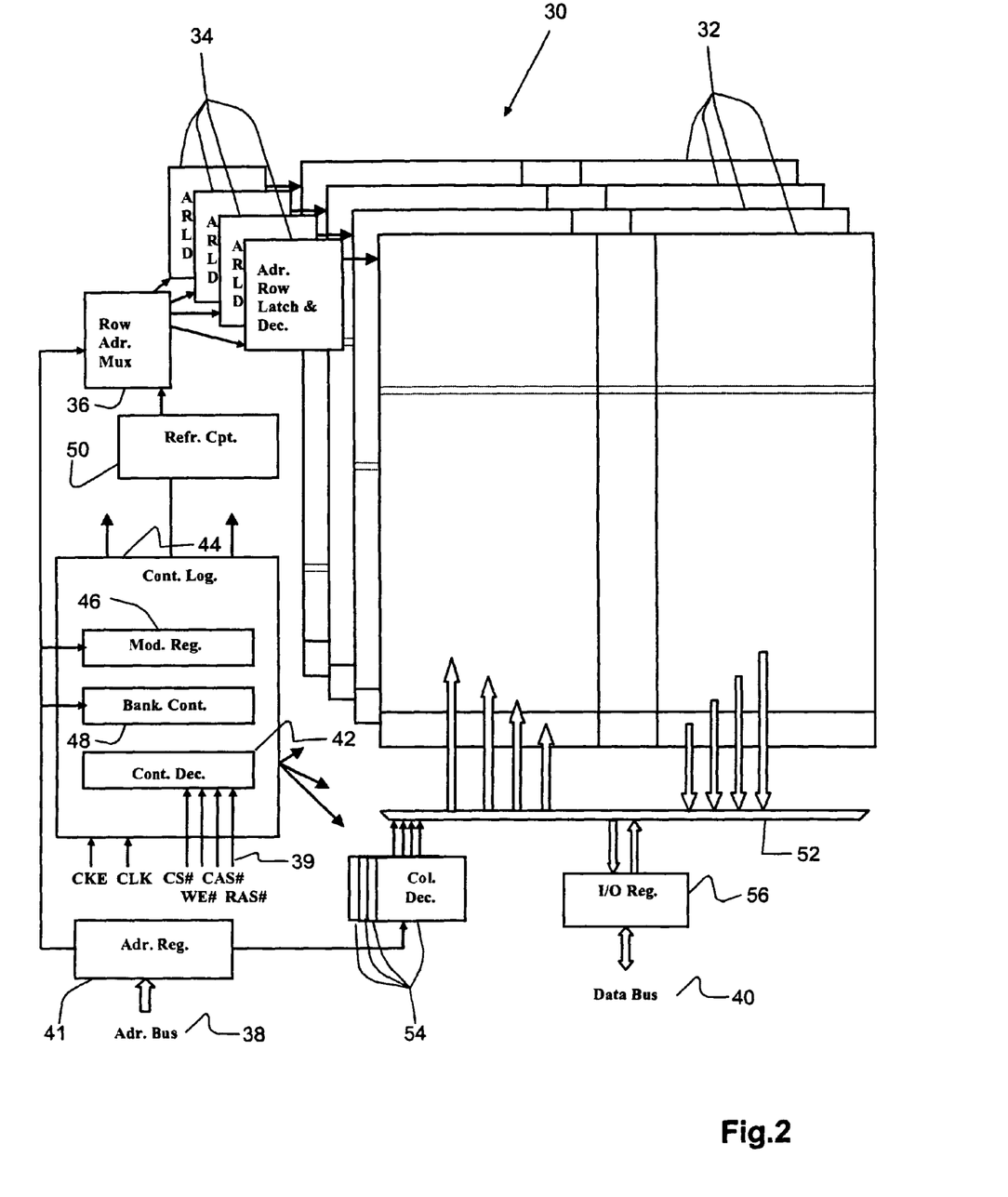
FIG. 2 shows a simplified diagram of a DRAM memory architecture with four memory banks.

FIG. 2 shows a simplified diagram of a DRAM architecture 30 with four memory banks 32 each having their own decoders 34 which are connected to a row address multiplexer 36. The number of memory banks in the DRAMs may be less than or equal to 8.

As a function of the desired features of the DRAM, the four banks 32 can be operated more or less independently. Thus, in order to obtain a DRAM with the highest possible performance, the banks 32 are totally uncoupled.

On the other hand, as is the case here, the operations on the banks 32 may be coupled more or less loosely, for reasons of distribution of the consumption peaks.

The DRAM 30 is controlled by an interface including an address bus 38, a command bus 39 and a data bus 40. The address bus 38 emits address signals which are stored in an address register 41. The command bus 39 emits command signals CS#, WE#, CAS# and RAS# which are decoded in a command decoder 42.

The interface of the DRAM is synchronised by means of a high speed clock CLK, which allows each of the operations to be expressed in a number of cycles of this clock. A signal CKE is also received in order to mask or validate the clock.

On the basis of the combination of signals CS#, WE#, CAS# and RAS# at the moment of sampling of the clock, the decoder 42 determines the command which is to be given.

The most common commands include:
resting;
cycle without operation;
precharging;
activation, i.e. row access, also called "activate";
reading or writing of a column;
termination of the writing burst, also referred to as "burst terminate";
auto refresh; and
loading of the mode register.

The operations associated with these commands may also require the presence of an address or a specific code on the address bus.

The length of the operations varies depending on the sequencing of commands. This makes it possible to ensure satisfactory electrical operation both at the level of the cell matrices and for proper use of the data bus.

It may be that certain timings are the result of requirements linked to considerations of consumption. This is the case for example with the tRRD, which sets the length of time between two "activate" commands, including those on separate banks, or with the tFAW which sets a total duration for four consecutive activate commands.

The command decoder 42 is part of a control logic 44 which also comprises a mode register 46 and a bank controller 48.

The mode register 46 makes it possible to configure various operating modes. It can be used for example to define the length of the data bursts, also referred to as the "burst length", the wrapping of the data, also referred to as the "wrap mode" or the electrical configuration of the data bus 40.

The control logic 44 is connected to a refresh counter 50. The refresh counter 50 serves to memorize the position of the current row for refreshing.

The manufacturer of the DRAM sets the refresh duration for all the memory, generally 64 ms, and hence the number of rows to be refreshed, for example 8K, i.e. one row to be refreshed roughly every 7.8 µs.

It is then up to the user to determine the most favorable moments for inserting the auto refresh commands so as not to interfere too much with their own access.

In order to do so, it is essential to take account of the fact that this command will have to close all the rows that are still open on all the banks in order to refresh the row indicated by the refresh counter.

The duration of an auto refresh command is generally about 60 ns and the refresh operation takes up between 1% and 2% of the total passband of the memory.

The refresh counter 50 is connected to the multiplexer 36 with the address register 41, thus making it possible to control the decoders 34 in order to operate the banks 32.

The result of these operations is managed at the level of the data bus 40 by a multiplexer/demultiplexer 52. The multiplexer/demultiplexer 52 stores the values of the memory addresses read off from the rows designated by the decoders 34 and the column designated by the decoders 54. The multiplexer/demultiplexer 52 and the decoders 54 operate in tandem in the manner of the decoders 34 and multiplexer 36 for the column access.

The address register 41 controls the decoders 54. This control enables data to be read and written in the banks 32. The exchange of data in the data bus 40 is then managed by an input/output register 56 for communication with the outside.

The data coming from or destined for all the memory banks 32 can be found on the two-way data bus 40. The user must himself manage the occupation of the bus to the nearest cycle.

With DRAM interfaces of the DDR type, there are two data per clock cycle, i.e. one for each clock front. The majority of the constraints are under the control of the user because he provides the DRAM with, in addition to the data, a sampling signal for each data octet known as the DQS, each front of the DQS serving to sample said data in the DRAM.

This means that, in the presence of data, the DQS signals are identical to the clock signal offset by a quarter of a cycle. By contrast, at the output, when the DRAM sends the DQS at the same time as the data that have been read, the fronts of the DQS are synchronous with the return clock.

It is thus for the user to generate the sampling signals from the DQS received, using a delay lock loop, also referred to as the DLL.

When the direction of the data bus 40 is reversed, some cycles are then lost during which the bus is kept at high impedance, to prevent short circuiting of the elements writing on the bus, and taking account of the transfer and synchronization times. Thus it is essential to avoid reversing the data bus 40 too often.

As writing is less prone to latency than reading, the DRAM controllers generally delay writing in order to group it so as to increase the efficiency of the DRAM.

In modern integrated systems, the data buses between the different elements have a great many disadvantages, including a monolithic architecture and lack of scalability.

In reaction to this, solutions based on networks on chip, also known as NoC, have been developed. These modern networks use one-way point to point links and switches at their nodes which make it possible to route the data packets coming from one or more input links towards one or more output links. Arbitration in these networks is spread over all the nodes.

As will be apparent from the foregoing, DRAM memories are particularly poorly adapted to this type of solution. In fact, the need to operate with low level commands while having no direct view of the state of the cycle of the DRAM, results in clumsy solutions which are unsatisfactory in performance terms.

Figure 3:
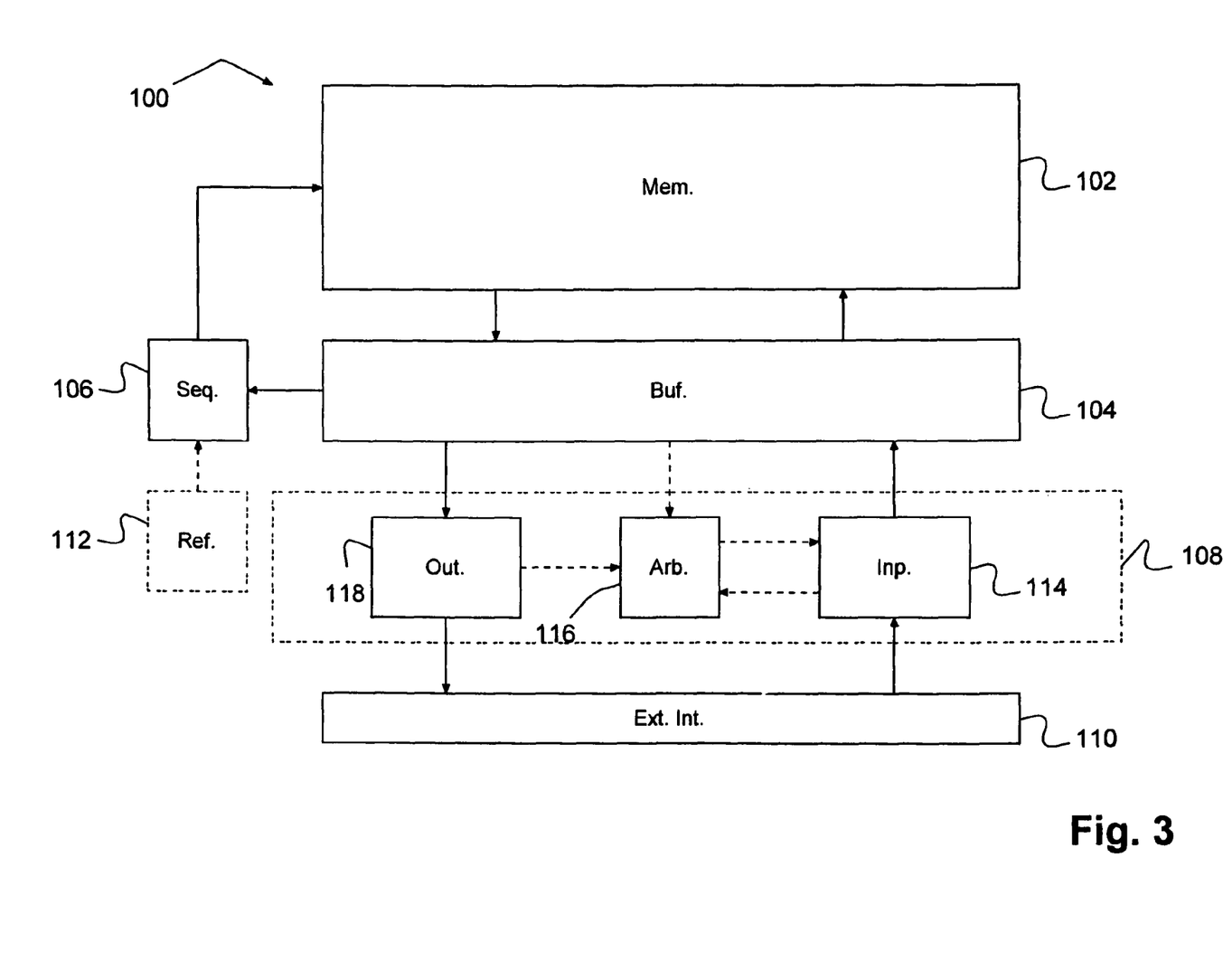
FIG. 3 shows a memory device.

To overcome these problems the applicants have developed a memory as shown in FIG. 3.

As can be seen from FIG. 3, an electronic memory device 100 includes a memory bank 102 of a dynamic nature with a cache 104 of a static nature, a sequencer 106, a request manager 108 and a physical interface 110.

The memory bank 102 may include any number of memory banks as described in connection with FIGS. 1 and 2. This number is between 1 and 8, or more if practicable. Advantageously, this number is limited to 1 in the embodiments described below.

In the embodiment described here, the cache 104 is a memory which is distinct from the memory bank 102. In other embodiments, the cache 104 includes the line activated in the matrix.

As will become apparent hereinafter, the cache 104 is of the "copy back" type, i.e., all access to the memory 100 passes through it. It would be possible, as an option, to adapt the architecture to use a cache of the "write through" type.

In the cache, a cache line does not necessarily correspond to a row in the memory bank 102. Such a row may itself contain up to several hundred columns. By contrast, the cache line contains sufficient DRAM columns for times such as precharging times, times of access to the differential amplifiers or for completing the restoration of the row after column writing (tRP, tRCD or tWR, respectively) to be spread over a sufficient column access number to make them insignificant in relation to the access time for the cache line.

In the embodiment described here, a cache line includes on the one hand raw data corresponding to a zone in the memory bank 102, and on the other hand an identifier or tag which identifies by means of an address the particular zone in the memory bank 102 to which these data correspond. Each cache line also includes an updating bit and a write lock bit, the functions of which will be explained hereinafter.

The sequencer 106 has the role of translating high level requests (for example a read request for a particular address over a given length) which are transmitted to it in commands comprehensible by the DRAM matrix, i.e. in low level requests.

The sequencer 106 may be operated with a state machine in which changes of state are possible only after counting a minimum number of cycles associated with each state transition, this number being specified by the designer of the DRAM. Other methods of operation are also possible for the sequencer 106.

As will become apparent hereinafter, the sequencer 106 executes requests coming from the cache 104. Optionally, a refresh module 112 may manage the refreshing of the memory bank 102.

Commands for refreshing the matrix may be slightly adjusted in time so as to be synchronized with the commands of the other types of access requested. If there is only one dynamic matrix, the refresh access is easier to insert as it is shorter than in a multiple-bank memory.

In other cases, for example if the matrix is used exclusively as a frame memory in a video-type application with complete read access every 40 ms, it is not necessary to add supplementary refresh access which would only increase consumption. Consequently, the refresh module may be deactivated during video applications.

The request manager 108 includes an input queue 114, an arbitration function 116 and an output queue 118.

The input queue 114 and output queue 118 are both connected by a one-way link to the physical interface 110. Thus, all the data entering the device 100 via the physical interface 110 are stored in the input queue 114 and all the data emitted to the outside of the device are initially stored in the output queue 118.

This configuration makes it possible to implement a particularly effective flow control, as will become apparent hereinafter. Other configurations are also possible.

In one particular embodiment the queues 114 and 118 store all the data associated with the requests which they receive. In conventional manner, the requests comprise contextual data (type of request, address, etc), generally present in the header of the request and the content of the requests, i.e. the associated data.

It is also possible to create these queues by using on the one hand queues that include only the contextual data and on the other hand a storage memory which includes only the contents of the requests, with a pointer each time, connecting each request to its context. This makes it possible in particular to mutualize the queues 114 and 118 whilst simplifying the processing of the requests.

The arbitration function 116 has the task of managing the order of execution of the requests contained in the input queue 114 so as to optimize the operation of the device 100.

Figure 4:
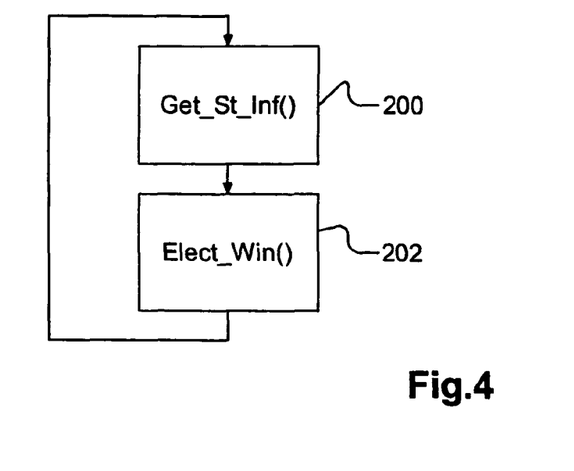
FIG. 4 shows a diagram of an operating loop of the arbitration function of the device in FIG. 3.

The mode of operation of this function will now be explained with reference to FIG. 4. As can be seen from FIG. 4, the arbitration function 116 is a loop that starts in a step 200 by receiving data that includes status information. These data are stored for the duration of the loop by means of a function Get_St_Inf( ).

This information is received at a certain number of input ports with a request presence signal for each port and optionally an associated priority (generally one, not more than two, bits).

In the example described here, and as shown in FIG. 3, the input ports of the arbitration function 116 are connected respectively to the cache 104, to the input queue 114 and to the output queue 118.

In each case, the arbitration loop terminates at 202 with the function Elect_Win( ), which emits a signal at an output port. In the example described here, the Elect_Win( ) function includes a number of filtering or masking logic layers and a final arbiter.

By a mask is meant a logic layer which eliminates requests according to a given criterion. The mask may, at any given moment, instantly eliminate all the requests present. For example, in order to stagger the current peaks, the DRAM energy management sequencer may at any given moment mask all the requests which are not carrying out a "cache hit", i.e. which are not already present in the cache.

By filtering is meant the selection of requests as a function of a given criterion. In a filter there is always at least one candidate at the output if there has been at least one at the input. For example, a priority filter with a plurality of priority levels will first of all determine the maximum priority level of the requests present and will then select the requests which are at this level.

In conventional manner, the final arbiter selects the oldest requests, from among the requests remaining, and, all things being equal, uses the port which was last used the longest time ago. An example of an implementation is the Arteris arbiter which is the subject of French patent application 2 899 413. Another example is an arbiter of the "round robin" type.

The upstream layers of the final arbiter are programmable and in the embodiment described here the function Elect_Win( ) generally uses 8 to 10 of them. Changing the order of the filters and masks will result in different behaviors, thus making it possible to carry out optimization of a function of the application and the NoC of the system chip.

Among the layers, the following may be found:

a "lock" type mask: this dedicates the memory to a single port throughout a lock period (lock: series of privileged transactions, the entire pathway from the initiator through the target is reserved by sending a lock type packet and released later by an unlock packet);

a mask of the "fifo room" type: analyses the remaining space in the output queue and prevents a request from being executed if the corresponding space cannot be reserved for the response;

one or more priority type filters of various kinds: according to the priority bits in the header of the requests, according to the priority assigned to a port (CPU priority port, for example) etc.;

a filter of the "cache hit" type: this favors requests the data of which are already in the cache; and a "power" type mask: this masks the requests that are carrying out a "cache miss" when the memory bank is unavailable in order to respect the constraints attached to consumption.

As can be seen from FIG. 3, the arbitration function 116 is connected to the input queue 114 in order to return an election signal to each request. Thanks to this loop, the arbitration function 116 at any moment designates the request of the input queue 114 which ought to be executed as a priority.

The decision whether or not to transfer the data linked to the request selected from the input queue 114 for execution is a committee decision linked to a flow control. The flow control is a process described in connection with FIG. 5, which makes it possible to ensure that every element of the network is carrying out the correct tasks at the correct time.

Figure 5:
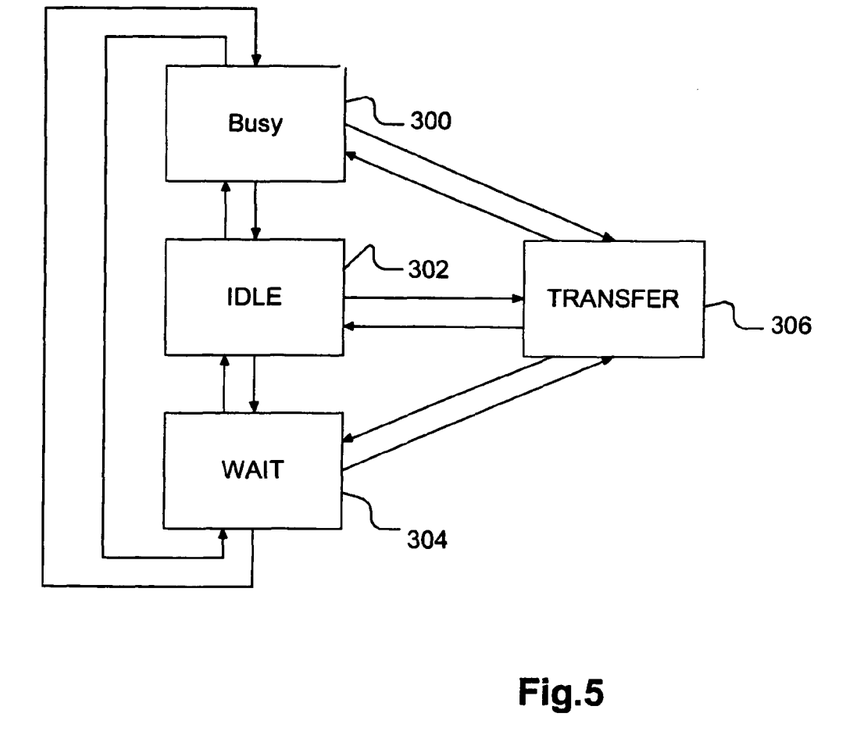
FIG. 5 shows a diagram of a flow control which takes place in the device in FIG. 3.

The flow control in the clock cycle is a series of exchanges of status information between the elements which are in communication, these changes of status providing information as to whether or not data have been transferred between the elements. The control is carried out on the information words passing through the point-to-point communication links between the elements that make up the device.

To prevent a blockage situation or deadlock, the flow control described here is based on the principle of non-withdrawal of one of the elements, either the upstream emitter or the downstream receiver.

Thus, each element in the device 100 emits a "valid" signal towards a downstream element when it places new data on the communications link. After having sent this signal this upstream element cannot supersede this emission.

Then, the downstream element, which is ready to receive the data present in the communications link in order to treat them, sends its state with a "ready" signal upstream. The downstream element thus warns the upstream element that the data will be sampled and consequently the upstream element can send new data to the next clock cycle on the communications link.

In fact, as all the elements of the device are connected to one another with the flow control, the whole of the integrated system can provide a higher quality of service. In fact, from the outside of the device 100 to the sequencer, the propagation of the flow control guarantees that the data can circulate freely. The flow control at the cycle level makes it possible to reduce the need for memory elements when transferring information into the chips (it is the words that are memorized rather than the complete packets).

The flow control is thus a series of states described as follows: upstream and downstream are used with reference to the flow of data, i.e. upstream supplies the data and downstream receives the data. An upstream element emits a "valid" state when new data are present and cannot retract this. The downstream element will sample these data when it is ready to absorb them and notifies its "ready" state upstream, indicating that at the end of the cycle the data present in the communications link will be sampled and consequently the upstream element can submit new data. The "valid" and "ready" signals are independent and represent, respectively, the state of the upstream element and of the downstream element. The communications link has four states:

Idle 302: the "valid" is not active and there is no packet in transit. This is the resting state.

Wait 304: the "valid" is not active and there is a packet in transit (gap in the supply of the packet). The downstream element must wait for the data to arrive in order to complete the packet.

Transfer 306: "valid" and "ready" are active. The data are actually being transferred.

Busy 300: a "valid" signal is obtained but no "ready" signal. The data are present but have not been picked up by the downstream element because the processing means are not available.

in a state 304 or "wait", the downstream element B is ready to receive the data and is waiting for the data. The upstream element A is not "valid" and is not sending data.

Looking at the case of the input queue 114, the flow control operates as follows.

The input queue 114, when it is not empty, permanently has a request selected by the arbitration function 116. The role of the input queue 114 is to transmit this selected request to the cache 104 for execution.

As long as the input queue 114 is not full, it sends an active "ready" signal upstream and as soon as the queue is full this "ready" signal is deactivated.

Here, the "valid" signal may be determined, for example, by the presence of a selected request. If there is a request selected and the cache 104 is sending an active "ready" signal, each word transferred is deleted from the queue 114 and the next word is submitted to the link between the queue and the cache 104. If the system is practically empty (only one write request in the queue 114 of which not all the cells have yet been received) and the cache 104, being ready (active "ready"), empties the queue 114, the latter ends up deactivating its "valid" signal.

In the example described here, the flow control and the requests or responses that have been received or sent at the physical interface are directly linked to a communications protocol created by the applicant, see patent application FR 2 900 017.

This protocol is particularly adapted to NoC and among other things sets out to render the contents of the packets independent, as well as the manner in which the packets are transported, so as to have a network topology which is most suited to the transportation of the packets.

Thus, according to this protocol, the header of the packets contains information pertinent to the communication, such as the size of the request, thus making it possible to reserve a space as soon as the first word arrives, forming a segment of a packet.

The request or response packets contain in their header the size of the associated data. As a result, before the end of the packets arrives, the size needed for storing the data is known. With this protocol the data can be aligned. The information sent can be independent of the structure of the links over which it is transported. A request and the corresponding response can be processed independently, so that this protocol allows improved transportation.

Figure 6:
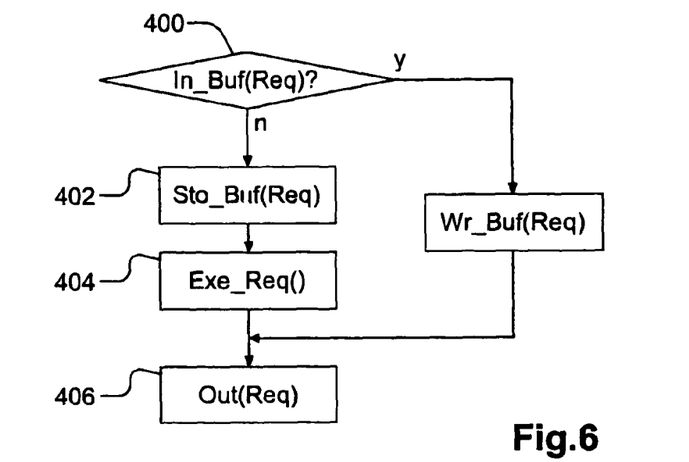
FIG. 6 shows a diagram of a read or write operation in the device in FIG. 3.

FIG. 6 shows a diagram of the execution of a selected request Req sent from the input queue 114 to the cache 104.

In a step 400, a check is made first of all, by means of the associated tag, that the corresponding data are not already present in the cache 104 (this is then a "cache hit" request) before reaccessing the memory bank 102. If the memory zone corresponding to the data is not represented in the cache 104 ("cache miss" request), first of all a cache line is released in order to allocate it to said memory zone before reaccessing the memory bank 102. A Sto_Buf( ) function is thus used at 402, explained with reference to FIG. 7.

Figure 7:
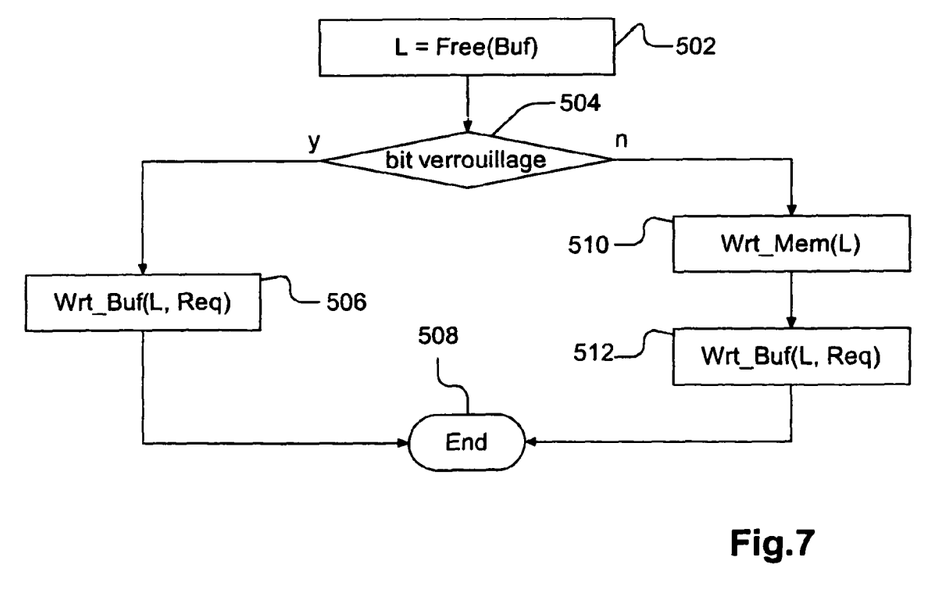
FIG. 7 shows a diagram of a function that is called up during an operation described in connection with FIG. 6.

The Sto_Buf( ) function starts by designating at 502 a cache line L to be released.

To designate the line which is to be released, the operator may choose to release, as a priority, the line of a "cache miss" nature which was accessed longest ago and which is not locked for a write operation. Other algorithms known to the skilled man may also be used, such as the designation of the "cache hit" line which was accessed longest ago.

At 504, a test is carried out on the locking bit to determine whether or not the line can be released. In other words, if the previous request associated with this line was a read or write request.

In the first case the previous request associated with L was a read request and the line L can therefore be used directly. Consequently, if the current request is a write request, the function Sto_Buf( ) launches at 506 a write access to the cache with a function Wrt_Buf( ) and stores the data associated with the request in the line L. Then the function Sto_Buf( ) terminates at 508 and the execution of the request continues at 404 with the function Exe_Req( ).

In the second case, the previous request associated with L was a write request and hence the line was locked and the contents of the line L should therefore first be written in the memory bank. This is carried out at 510 by a function Wrt_Mem( ) which takes L as its argument, and writes the contents of this cache line in the matrix.

Once the line L has been written in the memory bank, it then becomes free to receive the data of the current request Req if it is a write request, and the function Wrt_Buf( ) is called up with L as argument at 512. Then the function Sto_Buf( ) terminates at 508 and the execution of the current request continues at 404 with the function Exe_Req( ).

The function Exe_Req( ) may be implemented in various ways. One example of implementation includes, in the case of reading, in writing the cache line L with the corresponding data from the memory bank. In the case of a "cache hit", when the current request is a write request, the associated data can be written directly in the line L.

If it is a current read request, in the case of a "cache miss", the memory bank is then read at the desired address, and the function Out_Req( ) is called up at 406 with the data read. In the case of a "cache hit", the data are read in the cache. If it is not a read request, a read receipt is sent to the function Out_Req( ), and the data will effectively be written into the memory bank when the corresponding cache line is released later.

The function Out_Req( ) which is called up at 406 only receives the data from the cache and sends a "valid" to the output queue 118 in order to send the return data associated with the request which has just been executed.

The role of the locking and updating bits will now be explained. It may happen that certain initiators such as CPUs may try to write and read in the same cache line.

If the first request is a read request, this can operate in the cache line which then represents the current state of the memory, and the updating bit is then active.

By contrast, if the first request is a write request only the octets to be written can be re-read directly. In this case, during reading, access is gained to the associated row in the memory bank and, column by column, octet by octet, as a function of the octet validation bits, there will be selective writing and then reading in the memory bank to update the latter and the cache line.

The updating bit activated then indicates that all the octets represent the current state of the memory, all the octet activation bits are deactivated as well as the locking bit, because the writing has been done.

If a new request writes data into the cache line, the latter will remain up to date but the locking bit will be reactivated, together with the validation bits of the corresponding octets.

Figure 8:
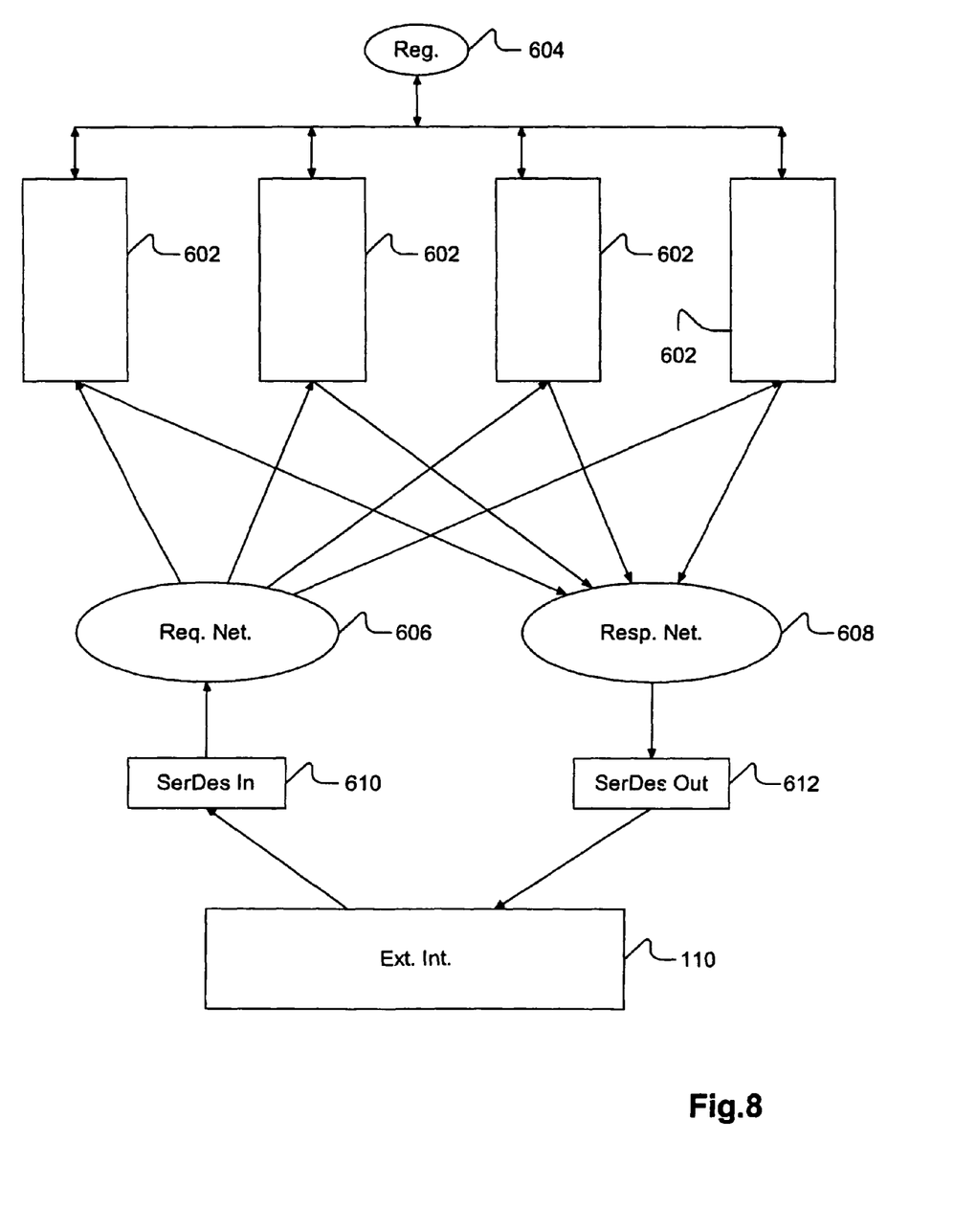
FIG. 8 shows an alternative embodiment of the memory device.

The device shown in FIG. 8 constitutes an improved embodiment designed to take advantage of the protocol described above.

For this purpose, a plurality of memory modules 602 are arranged in parallel. Each module 602 corresponds to the whole comprising the memory bank 102, cache 104, sequencer 106, arbitration function 116, input queue 114 and output queue 118 in FIG. 3. The memory bank 102 may include a selected number of memory matrices and thus adapt the performance of the device to particular applications.

The modules 602 are all connected to a power manager 604 the task of which is to prevent current peaks (if all the modules 602 are trying to access their respective bank 102 at the same time).

Two network agents, namely an input agent 606 and an output agent 608, are connected to each of the nodes in order to distribute the load among the modules 602 and thus take advantage of the communications protocol and the multiplicity of modules 602. The network agents may take the form of an NoC. One simple form of an input network agent is a switch with one input and n outputs (n being the number of modules 602). One simple embodiment of the output network agent is a switch with n inputs and one output.

The agents 606 and 608 are respectively connected to a deserialization module 610 and a serialization module 612, thus making it possible to have high bit-rate series links.

The agents 606 and 608 may also be supplemented by other agents which may for example make it possible to implement security or service quality policies, made possible by the communications protocol.

The foregoing description provides a number of embodiments. However, the scope of the invention extends to all combinations of features described above and the equivalents thereof.

What is claimed is:

1. Electronic memory device, comprising a bank of memories provided with a cache, and a sequencer for providing physical access to said bank of memories, as well as a physical interface for receiving high level memory access requests, and a request manager, wherein the request manager comprises an input queue for storing the high level memory access requests and an arbitration function which takes account of data of the cache and data of the input queue so as to designate a request which is to be executed, thus allowing the memory banks, sequencer and request manager to be produced on a single chip, the chip comprising one-way point-to-point links for high level request transportation, the physical interface providing a connection between the chip and the outside.

2. Device according to claim 1, wherein the memory manager comprises an output queue for receiving executed request data, and wherein the arbitration function also takes account of data from the output queue to designate the request which is to be executed.

3. Device according to claim 1, wherein the cache is provided between the memory banks and the input queue.

4. Device according to claim 1, wherein the arbitration function comprises selection masks.

5. Device according to claim 1, wherein the arbitration function comprises selection filters.

6. Device according to claim 1, further comprising a plurality of modules each having a memory bank, an input queue, an output queue and a cache, as well as a module manager connected to each of the modules and arranged between the physical interface and the modules.

7. Device according to claim 6, wherein the module manager comprises an input network agent and an output network agent connected to each module, said agents being arranged between the physical interface and the modules.

8. Device according to claim 7, further comprising a deserialization module between the physical interface and the input network agent, and a serialization module between the output network agent and the physical interface.

9. Device according to claim 1, wherein the memory bank is a DRAM memory.

10. Device according to claim 1, wherein the device receives and sends messages according to a transportation protocol selected for communication with an NoC.

* * * * *